(12) United States Patent
Rosenberg et al.

(10) Patent No.: US 6,955,938 B2
(45) Date of Patent: Oct. 18, 2005

(54) TANTALUM SPUTTERING TARGET AND METHOD OF MANUFACTURE

(75) Inventors: Harry Rosenberg, Pittsburgh, PA (US); Bahri Ozturk, Cranberry Township, PA (US); Guangxin Wang, Cranberry Township, PA (US); Wesley LaRue, Ellwood City, PA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/229,888

(22) Filed: Aug. 27, 2002

(65) Prior Publication Data

US 2003/0082864 A1 May 1, 2003

Related U.S. Application Data

(62) Division of application No. 09/717,476, filed on Nov. 20, 2000, now Pat. No. 6,566,161, which is a division of application No. 09/316,777, filed on May 21, 1999, now Pat. No. 6,323,055.
(60) Provisional application No. 60/086,868, filed on May 27, 1998.

(51) Int. Cl.[7] .............................................. H01L 21/00
(52) U.S. Cl. ........................ 438/77; 438/968; 257/736
(58) Field of Search ........................... 438/77, 93, 668, 438/968, 974; 257/736, 743, 750, 764, 766, 770, 775

(56) References Cited

U.S. PATENT DOCUMENTS

| | | | |
|---|---|---|---|
| 2,850,185 A | | 9/1960 | Meiller et al. |
| 3,933,474 A | | 1/1976 | Ham et al. |
| 3,984,208 A | * | 10/1976 | Moulin et al. |

(Continued)

FOREIGN PATENT DOCUMENTS

| | | |
|---|---|---|
| AU | 252442 | 6/1960 |
| DE | 19841774 | 3/1999 |
| EP | 0902102 | 3/1991 |
| JP | 55-179784 | 12/1980 |
| JP | 362259448 A | 11/1987 |
| JP | 62-297463 | * 12/1987 |
| JP | 03-197640 | 8/1991 |
| JP | 403197640 | 8/1991 |
| JP | 2000212678 A | 8/2000 |
| WO | WO96/20892 | 7/1996 |
| WO | WO 00/31310 | 7/2000 |

OTHER PUBLICATIONS

Cabot Performance Materials, Material Evaluation Report, Feb. 2, 1999, Ingot No. T0961.
Cabot Performance Materials, Material Evaluation Report, Mar. 25, 1998, Ingot No. T843A.
Trinitech International Inc., Material Evaluation Report, Apr. 13, 1994, Lot No. 6–15–2.
M. Bachter et al.: "Electrochemical and Simultaneous Spectroscopic Study of Reduction Mechanism and Electronic Conduction During Electrodeposition of Tantalum in Molten Alkali Chlorides", Ber. Bunsengers. Phys. Chem. 99, No. 1, 1995, pp. 21–31.
L. P. Polyskova et al.: "Secondary Processes During Tantalum Electrodeposition in Molten Salts", J. Applied Electrochemistry 22, 1992, pp. 628–637.
C. K. Gupta: "Extractive Metallurgy of Niobium, Tantalum and Vanadium", International Metals Review, vol. 29, No. 6, 1984, pp. 405–444.

(Continued)

Primary Examiner—Phuc T. Dang
(74) Attorney, Agent, or Firm—Wells St. John P.S.

(57) ABSTRACT

Described is a method for producing high purity tantalum, the high purity tantalum so produced and sputtering targets of high purity tantalum. The method involves purifying starting materials followed by subsequent refining into high purity tantalum.

13 Claims, 5 Drawing Sheets

U.S. PATENT DOCUMENTS

| | | | |
|---|---|---|---|
| 4,082,579 A | | 4/1978 | Masumoto et al. |
| 4,128,421 A | | 12/1978 | Marsh et al. |
| 4,673,554 A | | 6/1987 | Niwa et al. |
| 4,727,928 A | | 3/1988 | De Vynck et al. |
| 4,844,746 A | | 7/1989 | Horman et al. |
| 4,923,531 A | | 5/1990 | Fisher |
| 5,080,861 A | * | 1/1992 | Garde |
| 5,108,490 A | | 4/1992 | Yoshimura |
| 5,171,379 A | | 12/1992 | Kumar et al. |
| 5,196,163 A | * | 3/1993 | Matsuo et al. |
| 5,232,485 A | | 8/1993 | Yoshimura et al. |
| 5,242,481 A | | 9/1993 | Kumar |
| 5,244,556 A | | 9/1993 | Inoue |
| 5,442,978 A | | 8/1995 | Hildreth et al. |
| 5,635,146 A | | 6/1997 | Singh et al. |
| 5,707,599 A | | 1/1998 | Northway |
| 5,722,034 A | | 2/1998 | Kambara |
| 5,837,123 A | | 11/1998 | Wong et al. |
| 5,948,216 A | | 9/1999 | Cava et al. |
| 5,972,288 A | * | 10/1999 | Jeong et al. |
| 6,010,676 A | | 1/2000 | Singh et al. |
| 6,323,055 B1 | | 11/2001 | Rosenberg et al. |
| 6,331,233 B1 | | 12/2001 | Turner |
| 6,348,113 B1 | | 2/2002 | Michaluk et al. |
| 6,348,139 B1 | | 2/2002 | Shah et al. |
| 6,454,994 B1 | | 9/2002 | Wang |

OTHER PUBLICATIONS

Derwent abstract of WO 200031310–A1, Huber et al, Jun. 2, 2000, Derwent Acc. No. 200441864.

R. H. Burns et al.: "Evolution of Applications of Tantalum", in proceedings "Tantalum", edited by E. Chen et al., published by TMS, 1996, pp. 273–285.

A. Girginov et al.: "Electrodeposition of refractory metals (Ti, Zr, Nb, Ta) from molten salt electrolytes", J. Applied Electrochemistry, 25, 1995, pp. 993–1003.

World Wide Website, http://www.electrometals.com.su/EMEWTechProfile.html, Electrometal Technologies Limited, EMEW Electrowinning Technology Profile, 1999.

G. Jun et al.: "Low Temperature Deposition of TaCN Films Using Pentakis (Diethylamido) Tantalum", in MRS Symposium Proceedings, vol. 427: Advanced Metallization for Future ULSI, edited by K. N. Tu et al., published by MRS, 1996, pp. 349–354.

J. O. Olowolafe et al.: "The Effect of Ta to Si Ratio on Magnetron Sputtered Ta–Si–N Thin Films", J. Electronic Materials, vol. 28, No. 12, 1999, pp. 1399–1402.

World Wide Website: http://www.pwbrc.org/bmr/ew.htm, "Electrowinning", Sep. 6, 2000.

F. Lanteime et al.: "Electrodeposition of Tantalum in NaCl–KCl–$K_3TsF_3$ Melts", J. Electrochem. Soc., vol. 139, No. 5, 1992, pp. 1249–1255.

G. Li et al.: "Electrochemical reduction of tantalum in molten NaCl–KCl–$K_3TaF_3$", Transactions of Nfsoc., vol. 2, No. 3, 1992, pp. 64–68.

Fukang, et al., "Tantalum Industry in China," Symposium jointly sponsored by SCAMP and SMD (RMMC), 125th TMS Annual Meeting and Exhibition, Anaheim, California Feb. 1996, pp. 287–292.

Suri, et al., "Studies on Tantatum Extraction," Symposium jointly sponsored by SCAMP and SMD (RMMC), 125th TMS Annual Meeting and Exhibition, Anaheim, California Feb. 1996, pp. 39–46.

Eckert, "The Industrial Application of Pyrometallurgical, Chlorination and Hydrometellurty for Producing Tantalum Compounds," Symposium jointly sponsored by SCAMP and SMD (RMMC), 125th TMS Annual Meeting and Exhibition, Anaheim, California Feb. 1996, pp. 55–61.

Albrecht, et al., "Modern Extraction of Tantalum and Niobium with Special Emphasis on the Production of High Purity Compounds," *Conference Proceedings of Inter.Symp. On Tantalum and Niobium*, Nov. 1988, Brussels, Belgium, 22 pages.

Crockett, et al., "Niobium (Columbium) and Tantalum," International Strategic Minerals Inventory Summary Report, pp. 1–21 and 34–37.

Kononov, et al., "Electrorefining in Molten Salts—An Effective Method of High Purity Tantalum. Hafnium an Scandium Metal Production," Journal of Alloys and Compounds 216 (1995), pp. 173–176.

Bose, et al., "Preparton of Capacitor Grade Tantalum Powder," Transactions of The Indian Institute of Metals, Jun. 1970, pp. 1–5.

Symposium jointly sponsored by SCAMP and SMD (RMMC), 125th TMS Annual Meeting and Exhibition, Anaheim, California Feb. 1996, p. 240.

Korinek, "Tantalum—An Overview," Symposium jointly sponsored by SCAMP and SMD (RMMC), 125th TMS Annual Meeting and Exhibition, Anaheim, California Feb. 1996, pp. 3–15.

Pierret et al., "Operation of Electron Beam Furnace for Melting Refractory Metals" p. 206–217, Conference and date not known.

Aichert et al., "Progresses in the Economical Production of Very Clean Refractory Metals and Alloys by Electron Beam Melting," Conference Proceedings on Progress in the Economical Production of Very Clean Refractory Metals and Alloys, May 1985, Reutte, Austria, pp. 863–877.

Nair, et al., "Production of Tantalum Metal by the Aluminothermic Reduction of Tantalum Pentoxide," Journal of the Less–Common Metals 41 (1974) pp. 87–95, The Netherlands.

Rolsten, "Iodide Metals and Metal Iodides," John Wiley & sons, Inc., New York–London, 1961 pp. 8–17 and 110–119.

Klopp, et al., "Purification Reactions of Tantalum During Vacuum Sintering," Transactions of the Metallurgical Society of AIME, vol. 218, Dec. 1960, pp. 971–977.

Jain et al., "Pilot Plant Production of Capacitor Grade Tantalum Powder," Transactions of The Indian Institute of Metals, Dec. 1971, pp. 1–8.

Symposiuim jointly sponsored by SCAMP and SMD (RMMC), 125th TMS Annual Meeting and Exhibition, Anaheim, California Feb. 1996, p. 274.

Tittering, et al., "The Production and Fabrication of Tantalum Powder," Symposium on Powder Metallurgy, 1954, pp. 11–18.

Michaluk et al., "Factors Affecting the Mechanical Properties and Texture of Tantalum," Symposium jointly sponsored by SCAMP and SMD (RMMC), 125th TMS Annual Meeting and Exhibition, Anaheim, California Feb. 1996, pp. 205–207.

Tripp et al., "The Production of Tantalum by the Sodium Reduction Process," Symposium jointly sponsored by SCAMP and SMD (RMMC), 125th TMS Annual Meeting and Exhibition, Anaheim, California Feb. 1996, pp. 23–27.

Hughes et al., "Grain Subdivision and the Development of Local Orientations in Rolled Tantalum" Tantalum, The Minerals, Metals a Materials Society, 1996, pp. 257–242. (Year is sufficiently early so that the month is set an issue.).

Arlt, Jr., "Sulfonation and Sulfonation to Thorium and Thorium Compounds" Kirk–Othmer Encyclopedia of chemical Technology vol. 22, pp. 541–544. (1993. Year is sufficiently early so that the month is not an issue).

Kirkbride et al., "The Effect of Yitrium on the Recrystallization and Grain Growth of Tantralum", J. Leu–Common Metals, vol. 9, pp. 393–408, 1965. (Year is sufficiently early so that the month is not an issue.).

National Research Corporation Press Release, pp. 1–4, Jul. 1964.

National Research Corporation Data Sheet "SGS Tatalum", pp. 1–7, no date.

ASTM Standard Specification for Tantalum and Tantalum Alloy Plate, Sheet, and Strip, pp. 558–561, 1992. (Year a sufficiently early as that the month is not an issue).

Kock et al, Tantalum–Processing, Properties and Applications, JOM vol. 41., No. 10, Oct. 1989, pp. 33–39.

Kock et al., Tantalum–Processing, Propweties and Applications, JOM vol. 41, No. 10, Oct. 1989, pp. 33–39.*

* cited by examiner

TANTALUM SPUTTERING TARGET AND METHOD OF MANUFACTURE

RELATED PATENT DATA

This application is a divisional of U.S. patent application Ser. No. 09/717,476, which was filed on Nov. 20, 2000 now U.S. Pat. No. 6,566,161 which resulted from a divisional application Ser. No. of 09/316,777 filed May 21, 1999 now U.S. Pat. No. 6,323,055, filed on May 21, 1999, which resulted from a Provisional U.S. Patent Application Ser. No. 60/086,868, filed on May 27, 1998.

FIELD OF THE INVENTION

This invention relates to a method and apparatus for producing high purity tantalum and the high purity tantalum so produced. In particular, the invention relates to production of high purity tantalum.

BACKGROUND OF THE INVENTION

Tantalum is currently used extensively in the electronics industry which employs tantalum in the manufacture of highly effective electronic capacitors. This is mainly attributed to the strong and stable dielectric properties of the oxide film on the anodized metal. Both wrought thin foils and powders are used to manufacture bulk capacitors. In addition, thin film capacitors for microcircuit applications are formed by anodization of tantalum films, which are normally produced by sputtering. Tantalum is also sputtered in an Ar—$N_2$ ambient to form an ultra thin TaN layer which is used as a diffusion barrier between a Cu layer and a silicon substrate in new generation chips to ensure that the cross section of the interconnects can make use of the high conductivity properties of Cu. It is reported that the microstructure and stoichiometry of the TaN film are, unlike TiN, relatively insensitive to the deposition conditions. Therefore, TaN is considered a much better diffusion barrier than TiN for chip manufacture using copper as metallization material. For these thin film applications in the microelectronics industry, high purity tantalum sputtering targets are needed.

Most of the tantalum metal produced in the world today is derived from sodium reduction of potassium heptafluotantalate ($K_2TaF_7$). Processes which are not adapted commercially to any significant extent include the reduction of tantalum oxide ($Ta_2O_5$)with metallic reductants such as calcium and aluminum, and non metallic reductants carbon and carbon nitrogen; the reduction of the tantalum pentachloride ($TaCl_5$) with magnesium, sodium or hydrogen; and the thermal dissociation of $TaCl_5$.

Reduced tantalum is obtained either as powder, sponge or massive metal. It invariably contains significant amounts of oxygen, as well as other impurities such as reductants and impurities that may be present in the starting tantalum compounds. For removal of impurities in tantalum, electron beam melting is often conducted. During electron beam melting, most of the metallic impurities and interstitial gases are vaporized because of their high vapor pressure at the melting point of tantalum (2996° C.). Essentially all elements, except niobium, tungsten, molybdenum, uranium and thorium can be eliminated this way. While the metallic impurities and nitrogen are removed by direct volatilization, the removal of oxygen takes place via mechanisms involving formation and evaporation of carbon oxides, aluminum oxides, water, as well as suboxides of tantalum. The purity can be further improved by repeated electron beam melting.

Other refining processes include vacuum arc melting, vacuum sintering, molten salt electrorefining and tantalum iodide refining, with the iodide process being the most promising technique for removing tungsten and molybdenum.

The above mentioned refining methods are not effective for removal of niobium from tantalum. Since tantalum and niobium are closely associated with each other in nature, the removal of niobium is critical to prepare very high pure tantalum. In practice, their separation is conducted before reduction via methods such as solvent extraction, chlorination and fractional crystallization.

The tantalum target manufacturing process includes forging ingot into billet, surface machining billet, cutting billet into pieces, cold rolling the pieces into blanks, annealing blanks, final finishing and bonding to backing plates.

SUMMARY OF THE INVENTION

In accordance with the present invention there is provided a method and apparatus for producing high purity tantalum sputtering targets and the high purity tantalum so produced.

The method comprises purifying potassium heptafloutantalate, $K_2TaF_7$, reducing the purified $K_2TaF_7$ to produce tantalum powder, refining the tantalum by reacting with iodine and finally electron beam melting the tantalum to form a high purity tantalum ingot.

The starting material is commercial $K_2TaF_7$ salt, made by dissolving tantalum ores in hydrofluoric and sulfuric acid mixture, followed by filtration, solvent extraction using methkylisobutylketone (MIBK) and crystallization of $K_2TaF_7$. This can be repeated several times to lower the impurity levels, in particular the level of Nb.

Sodium reduction of purified $K_2TaF_7$ is conducted in a liquid liquid reduction retort where $K_2TaF_7$ and diluents (KCl and NaCl) are heated to about 1000° C. Molten sodium is then injected into the retort for reacting with $K_2TaF_7$. Agitation of the reactants is provided to accelerate the reduction reaction. After cooling, the mass is taken out of the retort, crushed, leached and washed to separate tantalum powder from the salt mixture.

Tantalum refining is done by the iodide process or electron beam melting. These methods can be used in parallel or in series. Electron beam melting is preferred as the last step because it results in an ingot which is suitable for further physical metallurgical steps toward the goal of target manufacture.

Electron beam melted ingot is forged into billets and surface machined. After surface machining, the forged billet is cut into pieces, which are further cold rolled into blanks. Blank annealing is carried out in an inert atmosphere to obtain a recrystallized microstructure. The blanks are then machined to obtain a final finish and bonded to copper or aluminum backing plates.

For characterization of targets produced by the invented process, chemical analyses are conducted. The methods of chemical analysis used to derive the chemical descriptions set forth herein are the methods known as glow discharge mass spectroscopy (GDMS) for metallic elements and LECO gas analyzer for non metallic elements.

The highly purified tantalum material of the present invention has less than 500 ppm by weight, total metallic impurities, an oxygen content of less than about 100 ppm, by weight, a molybdenum or tungsten content of not more than 50 ppm, by weight, and a uranium and thorium content of not more than 10 ppb, by weight. It is also possible to produce tantalum having less than 5 ppm, by weight, total of molybdenum and tungsten.

DETAILED DESCRIPTION

1) Precursor Purification and Sodium Reduction

In nature, tantalum generally occurs in close association with niobium, tin and other elements. The minerals most commonly used as raw materials in tantalum production are Tantalite, Wodginite, Micolite and Samarskite. These minerals are enriched by wet gravity, magnetic or electrostatic methods. The concentrates are dissolved in a mixture of hydrofluoric and sulfuric acid. The resulting solution is filtered, then separated from niobium and other impurities in a solvent extraction plant. The tantalum concentrate is transferred into an aqueous solution and precipitated with ammonia to yield tantalum acid ($Ta_2O_5xH_2O$), calcined at an elevated temperature to yield tantalum oxide. Alternatively, the tantalum is crystallized to potassium heptafloutantalate, by addition of KF and KCl to the hot aqueous solution obtained from solvent extraction. Impure potassium heptafloutantalate obtained by these methods must be further purified for use as a source of tantalum for the electronics industry.

In general, potassium heptafloutantalate may be purified by a procedure such as follows:

Technical grade potassium heptafloutantalate ($K_2TaF_7$) is dissolved in HF, e.g. a 49% HF solution. A mixture of HF and $H_2SO_4$ can also can also be used for the dissolution process. The amount of $K_2TaF_7$ dissolved depends on the temperature and concentration of HF. Since the dissolution rate is very slow at room temperature, the mixture is heated e.g. to 90° C. in a suitable container. The solution containing $K_2TaF_7$ is covered, to prevent losses due to evaporation, and stirred continuously. Time to dissolution is approximately one hour. A 65° C. KCl solution is added to the $K_2TaF_7$ solution and the resulting solution is stirred while cooling to room temperature. The tantalum in solution precipitates as $K_2TaF_7$ since the solubility of $K_2TaF_7$ is very low at room temperature. The precipitate is filtered, washed and dried. Niobium, tungsten, molybdenum, zirconium, uranium and thorium remain in solution. Repeated dissolution and precipitation may be useful in order to obtain extremely high purity tantalum. Elements such as niobium, tungsten, molybdenum, uranium and thorium, which are difficult to remove by electron beam melting, are easily removed by this process.

Potassium heptafloutantalate can be reduced to tantalum metal by fused salt electrolysis or reduction by sodium. The rate of reduction by electrolysis is very slow, therefore sodium reduction is used for processing large quantities of $K_2TaF_7$ into tantalum metal. The overall reduction reaction can be written as $$K_2TaF_7 + 5Na(l) = Ta(s) + 2KF + 5NaF \qquad (1)$$

Figure 1:
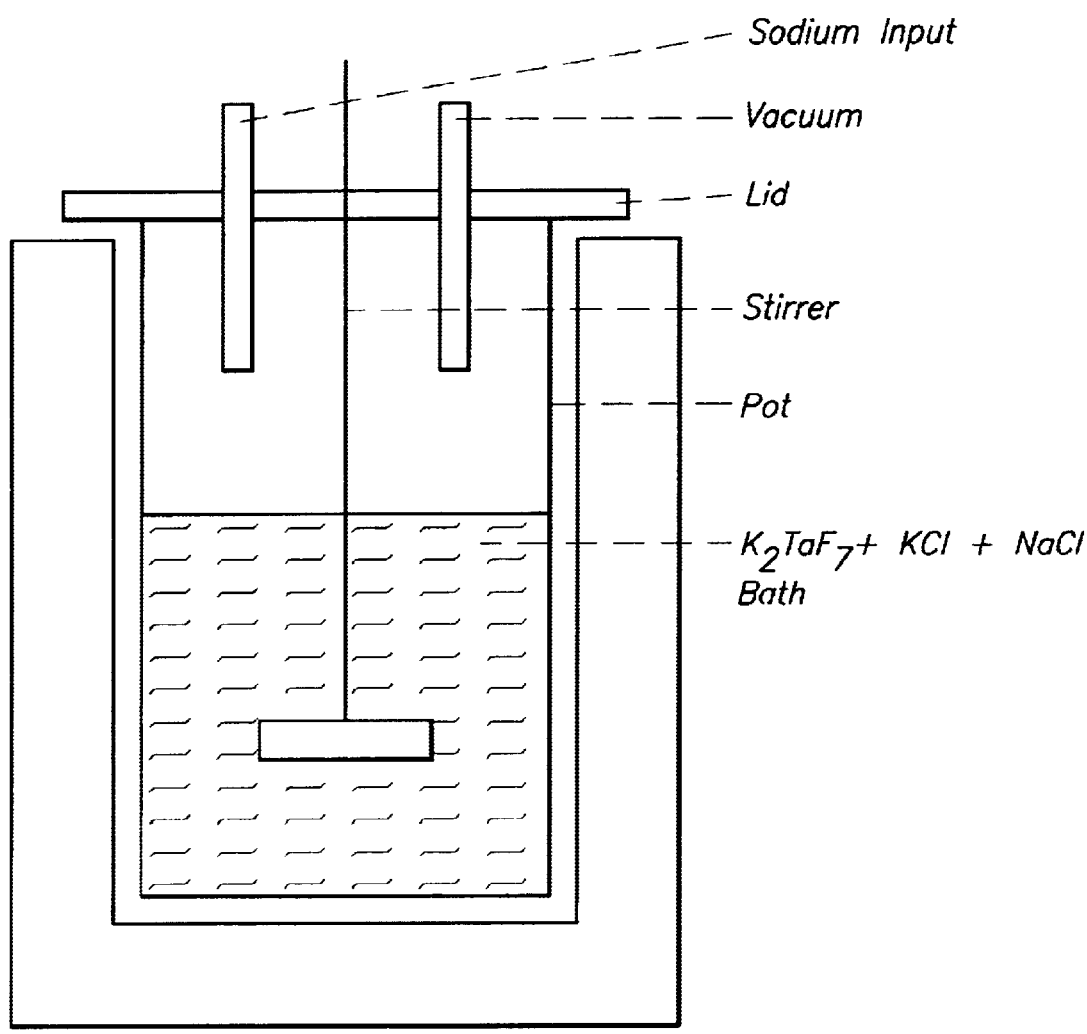
FIG. 1 is a schematic diagram of the liquid liquid reaction retort used for sodium reduction of $K_2TaF_7$.

Referring to the drawings, FIG. 1 shows a reduction furnace. The reduction is carried out by placing $K_2TaF_7$ and some dilute salts such as KCl, NaCl, LiCl, CsCl, $CaCl_2$, etc. into a reactor equipped with a stirring device. The reactor is placed in a furnace heated to above the melting point of the salt mixture, usually under 1000° C. Molten sodium is injected into the reactor and stirred while controlling the temperature. After cooling, the mass is removed from the reactor, crushed and leached with a dilute acid to recover tantalum metal powder. The powder is compacted and melted in an electron beam furnace.

2) Iodide Process

Tantalum metal is produced from the reduction of commercially available $K_2TaF_7$ by sodium, which is a process similar to the Hunter process used for the production of sponge titanium. The metal produced by the reduction of sodium contains most of the impurities that exist in the $K_2TaF_7$ such as Fe, Ni, Ti, W, Mo, etc. The metal is in the form of powder and has a very high oxygen content.

The method described herein is capable of producing high purity tantalum from scrap or impure tantalum metal. The process is based on chemical transport reactions, in which tantalum iodides are formed by the reaction of impure tantalum metal with iodine gas (synthesis zone), at lower temperatures, then the tantalum iodides are decomposed on a hot wire filament, at higher temperatures, to produce a very pure metal (deposition or thermal decomposition zone.). The impure tantalum is converted into gaseous species according to the following reactions in the synthesis zone:

$$Ta(s, \text{ impure}) + 5/2I_2(g) = TaI_5(g) \qquad \text{(Synthesis reaction) (2)}$$

$$Ta(s, \text{ impure}) + 5I(g) = TaI_5(g) \qquad \text{(Synthesis reaction) (3)}$$

Similar reactions can be written for the other tantalum iodide species, such as $TaI_3$ and $TaI_2$. The gaseous species of tantalum diffuse into the thermal decomposition zone and decompose to form pure tantalum metal according to the following reaction:

$$TaI_5(g) = Ta(s) + 5I(g) \qquad \text{(Thermal decomposition reaction) (4)}$$

The thermodynamic factors are important to understanding and controlling the process. Thermodynamic calculations have been carried out to determine advantageous operating conditions, such as temperature and pressure, in the synthesis and decomposition zones.

Figure 2:
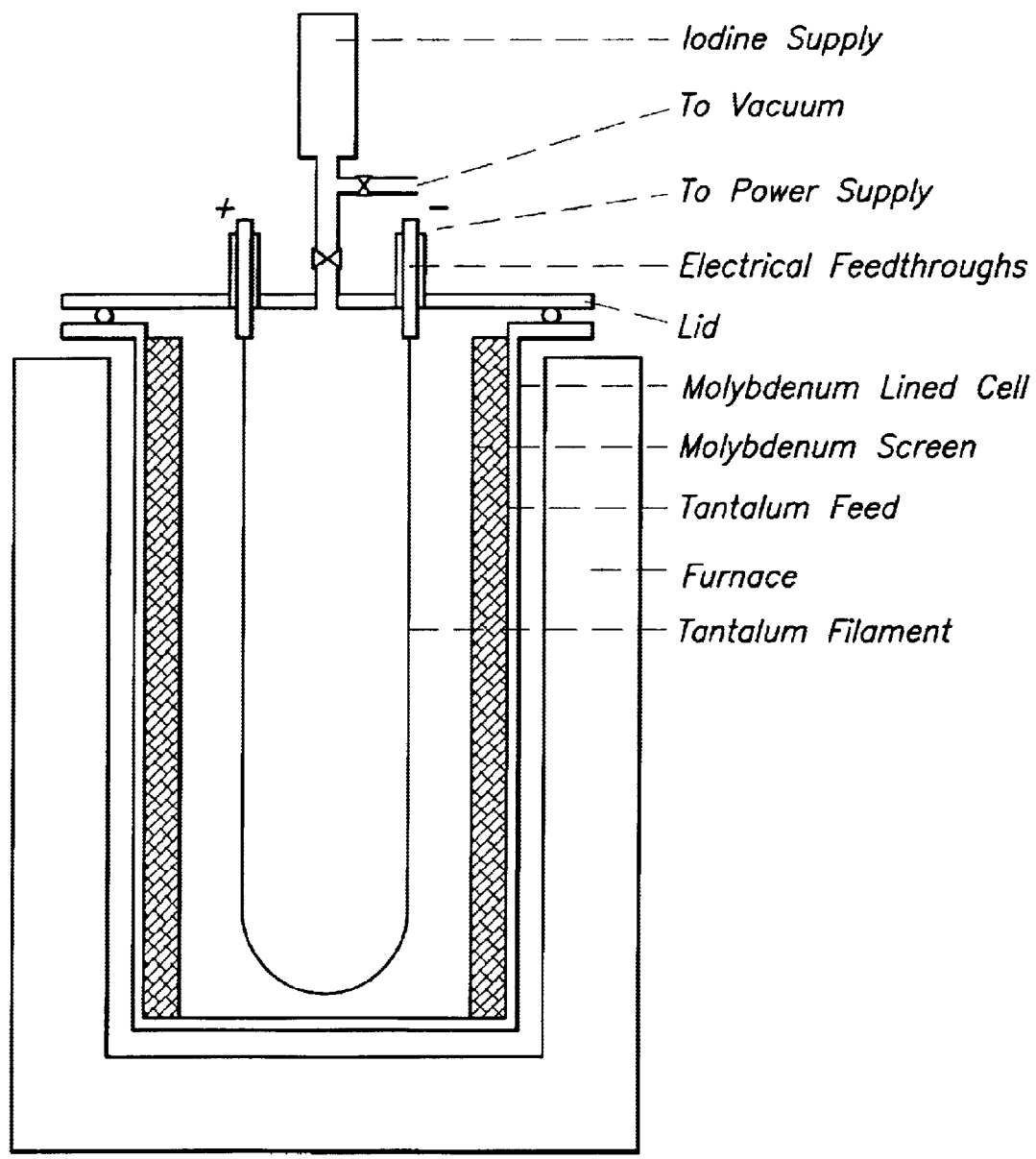
FIG. 2 is a schematic diagram of an iodide cell.

A schematic diagram of the apparatus is shown in FIG. 2. The process apparatus contains a cell, filament and feed material and is designed to run batch operations. After each run the apparatus is cooled to room temperature and disassembled.

The preferred iodide cell, for the refining of tantalum, is an alloy 600 (Inconel) container clad with a metal more electrochemically noble than tantalum according to the chloride electromotive series, such as molybdenum or tungsten or an alloy thereof. The cladding prevents contamination of the refined tantalum by cell components since molybdenum and tungsten do not react with iodine at cell operating temperatures. Alloy 600 (Inconel) containers are also used for the refining of metals such as Ti and Zr, without cladding, since these metals are refined under different operating conditions.

A filament made of pure tantalum rod is used for the decomposition surface. The filament can be in the shape of a U or can be a different shape to increase its surface area. It is also possible to use multiple filaments to increase the surface area and cell productivity. The filament is heated resistively by an external power supply. Since the filament temperature affects the deposition rate, the current is controlled to maintain the filament temperature between 1000 and 1500° C. Tantalum crystals then grow on the filament.

A cylindrical molybdenum screen is placed in the cell to provide an annular space 1 to 3 inches wide. The annular space if filled with tantalum feed material in the form of chips, chunks or small pellets. This type of arrangement gives a high surface area for the reaction between feed material and iodine gas in the cell. The crude tantalum can also be compacted to a donut shape and placed in the reactor. The feed materials are cleaned with cleaning agents before they are charged into the cell.

A good vacuum system is advantageous to producing tantalum with low impurities. Therefore, the cell is connected to a vacuum system producing 1 micron or less of pressure. The cell is evacuated at room temperature, then heated to around 800–1000° C. under vacuum to remove all the volatile impurities before iodine is added.

The temperature in the synthesis zone effects the rate of reaction. The temperature in the synthesis zone should be uniform and kept much higher than boiling point of $TaI_5$. A special heater placed on the lid of the cell keeps the temperature at around 350–500° C., which prevents the condensation of iodides under the lid. Without this heater, iodine must be continuously added to the system.

Oxygen in tantalum originates from numerous sources, starting with the precursor and on through electron beam melting. Oxygen is undesirable at high concentrations due to its effect on the resistivity of deposited tantalum thin films. Currently available methods cannot easily decrease the oxygen levels to less than 30 ppm. Thermodynamic calculations, as well as the experimental results, indicate that the metal oxides formed or present in the feed material do not react with iodine and are not transported to the decomposition zone. Therefore, this process is capable of producing high purity tantalum with very low oxygen. The amount of oxygen remaining in the cell atmosphere is reduced by a combination of argon flushing and vacuum. Nitrogen in the feed material behaves like oxygen, therefore the nitrogen content of tantalum crystal bar will be very low.

Electron beam melting is frequently used to refine tantalum. However, electron beam melting cannot remove elements such as tungsten and molybdenum, since the vapor pressures of these elements are very low at the melting temperature of tantalum. The present process is capable of consistently removing elements such as tungsten and molybdenum to extremely low levels. The process may also remove uranium and thorium, which cannot be removed by electron beam melting.

Figure 3:
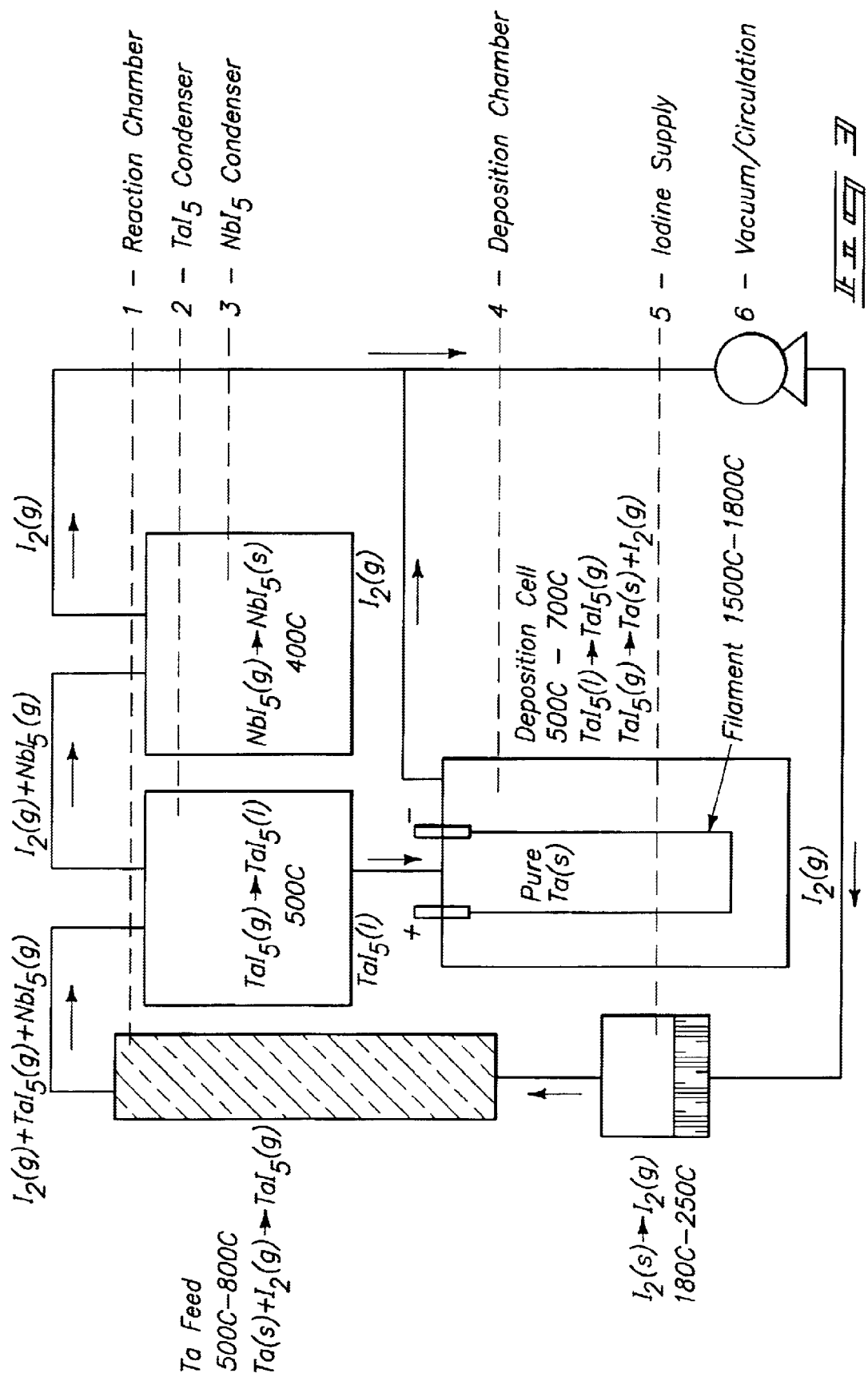
FIG. 3 is a schematic diagram illustration an iodide cell with a distillation unit.

The iodide process described above may not be able to remove significant amounts of niobium. Therefore, the current process has been modified to obtain pure tantalum with very low metallic impurities including niobium. In the modified process, tantalum scrap or crude tantalum is reacted with iodine gas to form gaseous $TaI_5$ and $NbI_5$, which then are separated by fractional distillation, since the boiling points of these two compounds are different. A schematic of the apparatus is shown in FIG. 3.

Crude tantalum or scrap is placed in a vertical tube made of Inconel and clad with molybdenum, tungsten or an alloy thereof. The tube is placed in a furnace that is heated to 400–700° C. A carrier gas such as clean argon or helium is passed over an iodine bath. The temperature of the bath is adjusted to get a specific $I_2$ partial pressure. Iodine gas reacts with tantalum scrap to produce gaseous tantalum and niobium iodide. The gas from the feed reactor passes through the distillation columns. The temperature of the first column is maintained just below the boiling point of $TaI_5$, to condense $TaI_5$. The second column is maintained at a temperature low enough to condense $NbI_5$, but above the boiling point of $I_2$. The iodine gas is circulated through the process of reuse. All the gas lines between the first column and furnace are made of molybdenum and maintained at about 600° C., the others are maintained at lower temperatures.

The pure liquid or solid $TaI_5$ obtained from the fractional distillation unit is fed into the deposition rector and the $TaI_5$ decomposes on a hot surface to produce pure tantalum crystals. Tantalum obtained from this process is very pure and free of all impurities that cannot be removed by conventional processes. The pure tantalum obtained by the modified iodide process is electron beam melted to produce high purity tantalum ingots.

3. Electron Beam Melting

Electron beam melting is commonly used to melt and refine refractory materials.

The process is based on the use of the intense heat generated when a high energy particle stream impinges on a material, transforming its kinetic energy into thermal energy. The flexibility to distribute energy yields a large number of electron beam melting techniques such as button, drip, hearth, zone melting, etc. for various metals. Electron beam hearth melting has been established for titanium and super alloys. Electron beam drip melting may be used for refractory materials. An electron beam drip melting furnace compromises a horizontal bar feeder for primary feedstock. The bar feeder is equipped with a vacuum valve which allows nearly continuous feeding and melting of precompacted materials. The refining of refractory metals occurs via vaporization of suboxides, evolution and removal of gases, carbon-oxygen reaction and vaporization of metallic impurities. Most of the elements can be removed from tantalum during melting by the one of above mechanisms. However, electron beam melting cannot remove W, Mo, Nb, U, Th, etc. due to low vapor pressures of these elements at the melting temperature. Repeated melting may be necessary to get very high purity materials.

Scrap, impure tantalum, tantalum powder obtained from electrolysis or reduction of $K_2TaF_7$ is compacted and melted in an electron beam drip melting furnace to produce high purity tantalum ingots.

4. Target Manufacturing

Figure 4:
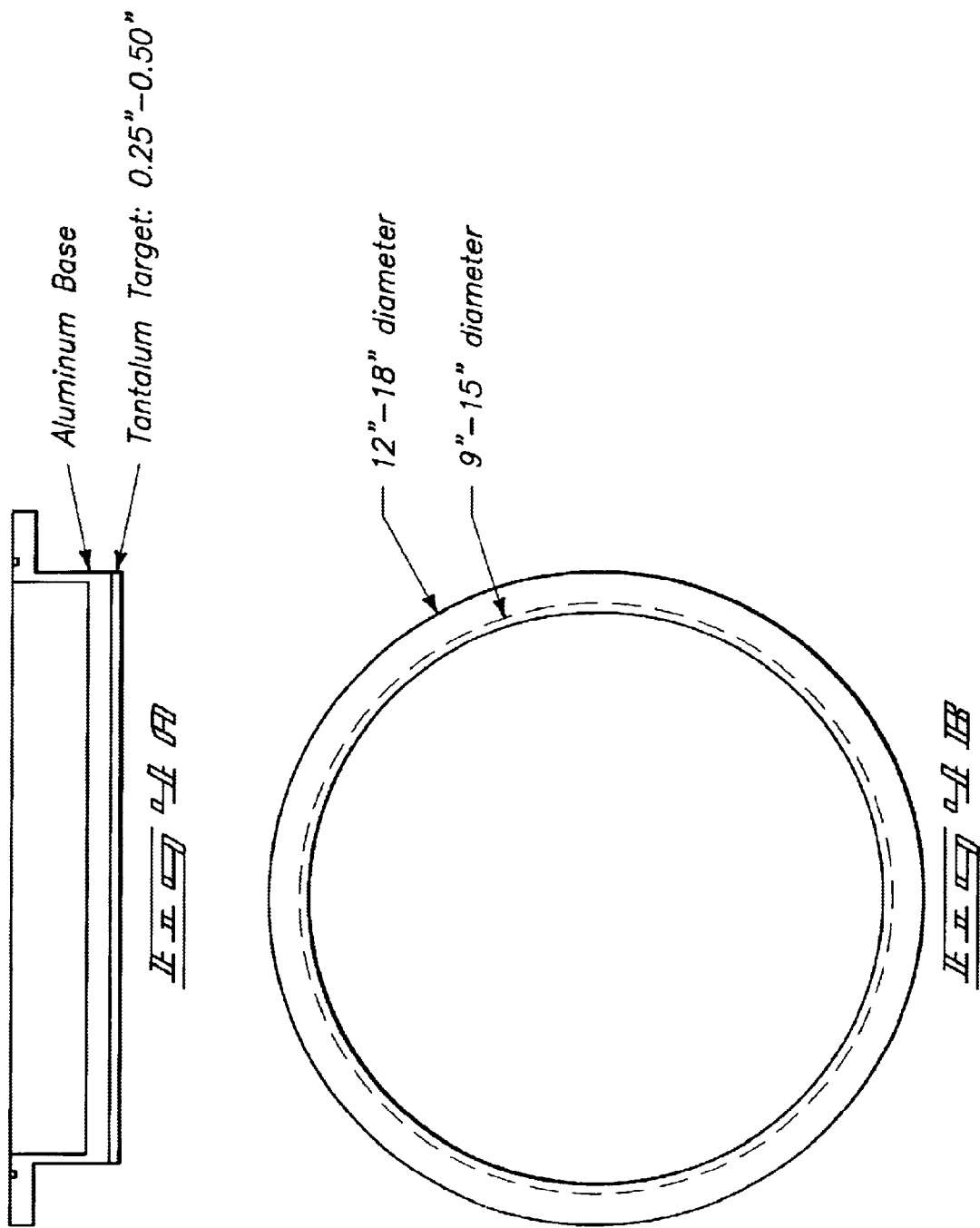
FIGS. 4A and 4B are schematic diagrams of a tantalum target.

Ingots obtained from electron beam melting are forged into billets and surface machined. After surface machining, the forged billet is cut into pieces, which are further cold-rolled into blanks. The blanks are annealed in an inert atmosphere to obtain the desired microstructure. The blanks are then machined to obtain the final finish and may be bonded to copper or aluminum backing plates. A schematic of the target produced is shown in FIGS. 4A and 4B.

It is desirable to perform a chemical analysis and characterization of targets by measuring the grain size and texture. The methods of chemical analysis useful to derive the chemical descriptions set forth herein are the methods known as glow discharge mass spectroscopy (GDMS) for metallic elements and LECO gas analyzer for non-metallic elements. Line interception method is used for grain size determination and XRD and EBSP are used to obtain texture data.

EXAMPLE 1

About 350 grams of $K_2TaF_7$ was added to 595 cc of HF (49%) in a Teflon beaker. The mixture was heated to 90° C. and stirred continuously. The beaker was covered with a Teflon plate to prevent evaporation of the solution. The dissolution process lasted about one hour. About 140 grams of KCl was dissolved in 700 cc of distilled water and heated to 60 C. The KCl solution was added to the $K_2TaF_7$ solution and the resulting solution was stirred for several minutes. The solution was cooled to room temperature which caused the tantalum in the solution to be precipitated as $K_2TaF_7$, since the solubility of this compound is very low at room temperature. The precipitates were filtered and washed with KF solution (100 gr/liter $H_2O$) and distilled water. The powder was dried at 160° C. in a vacuum furnace, then analyzed for composition. X-ray diffraction studies were carried out on the precipitates.

Several examples were carried out according the procedure described above and samples were analyzed. The niobium content of $K_2TaF_7$ was reduced by 50 percent after the first treatment. The results are shown in Table 1. The data shown in Table 1 indicates it is possible to decrease the niobium content of tantalum by this method. The purified $K_2TaF_7$ may be reduced by sodium.

TABLE 1

| Element | Original $K_2TaF_7$ | $K_2TaF_7$ After First Wash | $K_2TaF_7$ After Second Wash |
|---|---|---|---|
| Nb | 4.6 | <2.2 | <1 |
| Mo | 0.2 | 0.1 | 0.1 |
| W | 4.8 | 1.1 | <1 |
| Zr | 0.52 | 0.14 | <0.1 |
| Th | <0.01 | <0.01 | <0.01 |
| U | <0.01 | <0.01 | <0.01 |
| Na | 1100 | 130 | 50 |
| Fe | 4.8 | 1.2 | <1 |
| Al | 2.5 | 1.2 | |
| S | 8.7 | 1.1 | |

The data in Table 1 has shown that the contents of Nb, Mo and W are largely lowered by this method. It is well known that these elements cannot be removed from Ta metal by electron beam melting. Therefore, a removal of these three elements from the $K_2TaF_7$ is beneficial to producing very pure tantalum. Assuming all Nb, Mo and W in the $K_2TaF_7$ will be co-reduced with Ta in the sodium reduction stage and neglecting the existence of all other elements listed in Table 1, a simple calculation can be made to show the influence of the $K_2TaF_7$ purification on metal purity. A complete sodium reduction of 1000 g of original $K_2TaF_7$ would produce 461.7 g of Ta which would contain 9.6 mg of Nb, Mo and W, resulting in a metal purity of 99.9979%. When using 1000 g twice washed $K_2TaF_7$, 461.7 g of Ta produced by sodium reduction would contain less than 2.1 mg of Nb, Mo and W. The metal purity would then be 99.9995%.

EXAMPLE 2

An iodide cell was used to produce pure tantalum from scrap available in the market. The cell was made of an Inconel alloy and lined with molybdenum for the preliminary experiments. A molybdenum screen was placed inside the cell and Ta scrap was used to fill the gap between the screen and the cell wall. The cell was leak checked, then evacuated to below 10 microns. The cell was heated to 850 C, under vacuum, to evaporate and remove organic and other volatile compounds. Then the cell was cooled to room temperature and the precipitates on the lid were cleaned. A filament made of pure Ta was installed on the cell lid. The cell was sealed and evacuated to below 10 microns again. The feed was heated to about 500–600° C. and the filament to 1000–1200 C. When the feed and filament temperature were stabilized, a measured quantity of iodine crystals were added to the reaction chamber. The current and voltage supplied to the filament were measured continuously. From these values it is possible to calculate the conductance, which is related to the diameter of the bar. The vessel pressure, and filament and feed material temperatures were controlled. Tantalum bars are successfully grown by this method.

Figure 5:
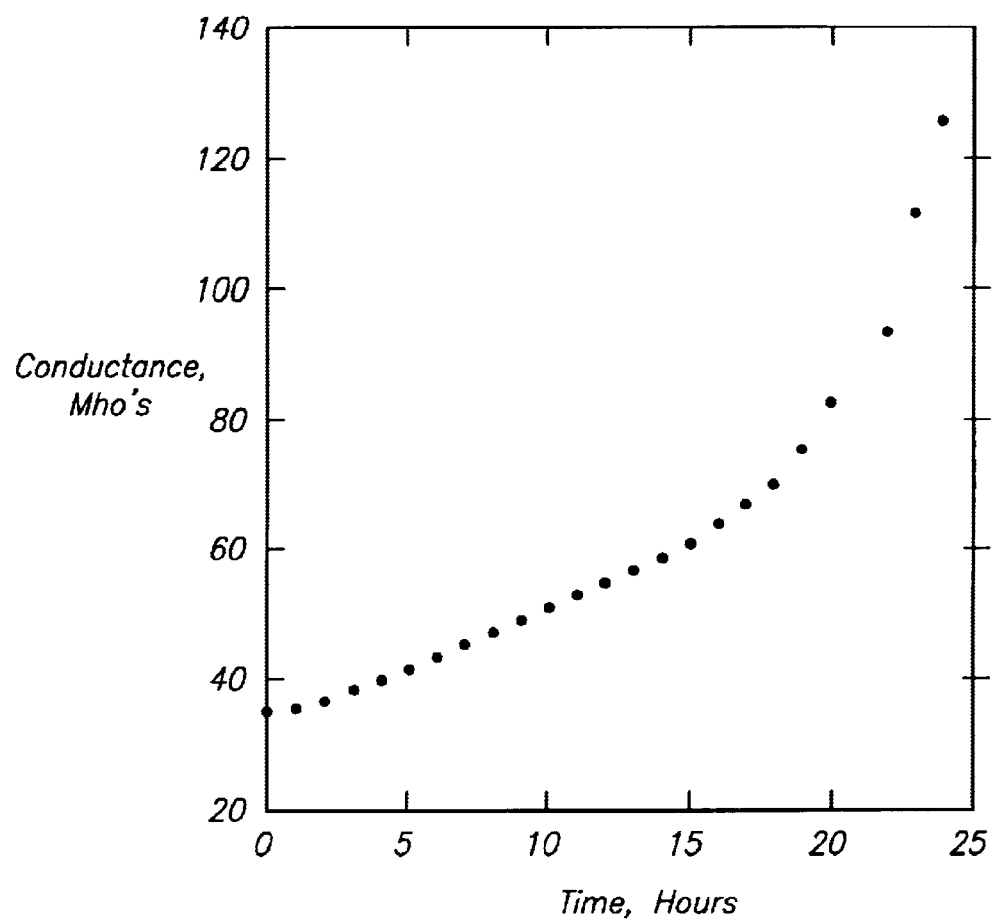
FIG. 5 is a graph of conductance of tantalum bar as a function of time.

It was found that the temperature of the filament and feed as well as the pressure affects the deposition rate significantly. The growth rate of Ta bar is related to conductance of Ta bar. The growth rate in terms of conductance (Mho) is shown in FIG. 5. Very high deposition rates are obtained by this method as shown in FIG. 5. Chemical analyses of the resulting tantalum bars from several runs are given in Table 2. It must be noted that scrap used in the experiments was not homogenous in composition. The original composition of the tantalum feed material is also shown in Table 2.

TABLE 2

| | | Run 1 | Run 2 | | Run 3 | Run 4 |
|---|---|---|---|---|---|---|
| Time, hrs | | 79 | 45 | | 62 | 45 |
| Weight, gr | | 5925 | 5043 | | 7829 | 5969 |
| Element (ppm) | Feed 1 & 2 | Run 1 | Run 2 | Feed 3 & 4 | Run 3 | Run 4 |
| Nb | 1200 | 900 | 505 | 90 | 185 | 230 |
| Mo | 6 | 1.2 | 1.7 | | 1.3 | 1.2 |
| W | 30,000 | 0.28 | 0.19 | | 0.2 | 0.25 |
| O | 100 | 90 | 308 | 100 | 60 | 176 |
| N | 100 | <10 | 3 | 100 | 6 | 4 |

EXAMPLE 3

Tantalum crystal bars from various runs were melted in an electron beam furnace. The analytical results of the tantalum feed stock and the melted tantalum ingot are shown in Table 3.

TABLE 3

| Element | Feed Material Concentration (Average ppm) | Concentration After Melting (Average ppm) |
|---|---|---|
| Fe | 344 | 1 |
| Ni | 223 | 0.13 |
| Cr | 205 | 0.19 |
| Nb | 463 | 270 |
| O | 221 | <25 |

EXAMPLE 4

Ingots obtained from electron beam melting are cold worked and annealed to produce target blanks. Initial ingot breakdown is done via a combination of side and upset forging. After surface machining, the forged ingot is cut into pieces, which are further cold rolled into blanks. Two rolling temperatures are considered: room temperature and liquid nitrogen temperature. The former is called cold rolling, while the latter is referred to as cryogenic rolling. The reduction at rolling is in the range of 70 to 90%. The rolled blanks are annealed in an inert atmosphere or vacuum under different conditions to obtain the desired microstructure and texture.

EXAMPLE 5

Blanks with fine grains and desired texture are machined to obtain the final finish and bonded to copper or aluminum backing plates. A schematic of the target produced is shown in FIGS. 4A and 4B.

In the foregoing discussions, it is apparent that various changes and modifications may be made within the preview of the invention. Accordingly, the scope of the invention should be limited only by the appended claims.

What is claimed is:

1. A capacitor comprising high purity tantalum comprising tantalum, less than about 500 parts per million, by weight, total metallic impurities, and less than about 50 parts per million, by weight, tungsten or molybdenum.

2. The capacitor of claim 1 wherein the high purity tantalum is formed in the capacitor by sputter deposition.

3. A capacitor comprising a material sputter deposited from a target blank, the material comprising tantalum, less than 500 parts per million by weight total metallic impurities, less than or equal to 50 parts per million by weight molybdenum or tungsten, and less than about 100 parts per million by weight oxygen.

4. A capacitor comprising a material sputter deposited from a target blank, the material comprising tantalum, less than 500 parts per million by weight total metallic impurities, less than 5 parts per million by weight total of molybdenum and tungsten, less than about 100 parts per million by weight oxygen, and less than or equal to 10 parts per billion by weight each of uranium and thorium.

5. A capacitor comprising material sputter deposited from a target blank, the material comprising tantalum, less than 500 parts per million by weight total metallic impurities, less than 2 parts per million by weight total of molybdenum and tungsten, and less than 25 parts per million by weight oxygen.

6. The capacitor of claim 1 wherein the high purity tantalum comprises less than 5 parts per million by weight molybdenum or tungsten.

7. The capacitor of claim 6 wherein high purity tantalum comprises less than 3 parts per million by weight molybdenum or tungsten.

8. The capacitor of claim 1 wherein the high purity tantalum comprises less than 5 parts per million by weight each of molybdenum and tungsten.

9. The capacitor of claim 8 wherein the high purity tantalum comprises less than 3 parts per million by weight each of molybdenum and tungsten.

10. The capacitor of claim 1 wherein the high purity tantalum further comprises less than 50 parts per million by weight niobium.

11. The capacitor of claim 3 wherein the high purity tantalum further comprises less than 50 parts per million by weight niobium.

12. The capacitor of claim 3 wherein the high purity tantalum comprises less than 5 parts per million by weight total of molybdenum and tungsten and further comprises less than 50 parts per million by weight total of molydenum and tungsten and further comprises less than 50 parts per million by weight niobium.

13. The capacitor of claim 1 wherein the total metallic impurities include aluminum.

* * * * *

UNITED STATES PATENT AND TRADEMARK OFFICE
CERTIFICATE OF CORRECTION

PATENT NO. : 6,955,938 B2
APPLICATION NO. : 10/229888
DATED : October 18, 2005
INVENTOR(S) : Harry Rosenberg et al.

It is certified that error appears in the above-identified patent and that said Letters Patent is hereby corrected as shown below:

Title Page 1, Item 56 References Cited, U.S. PATENT DOCUMENTS:
Replace "2,850,185 A   9/1960   Meiller et al."
With --2,950,185 A   8/1960   Hellier et al.--

Title Page 2, Item 56 References Cited, U.S. PATENT DOCUMENTS, please insert:
--6,130,451   10/2000   Hasegawa-- before "6,323,055".

Title Page 3, Item 56 OTHER PUBLICATIONS, please delete:
"Kock et al., Tantalum-Processing Propweties and Applications, JOM vol. 41, No. 10, Oct. 1989, pp. 33-39.*--

Title Page 3, Item 56 OTHER PUBLICATIONS, please insert:
--Kumar, et al., "Effect of Intermetallic Compounds of the Properties of Tantalum" Materials Research Society Symposium Proceedings, vol. 322, pp. 413-422, 1994.--

Title Page 3, Item 56 OTHER PUBLICATIONS, please insert:
--Kumar, et al., "Effect of Intermetallic Compounds of the Properties of Tantalum" Refractory Metals & Hard Materials, vol. 12, pp. 35-40, 1994.--

Title Page 3, Item 56 OTHER PUBLICATIONS, please insert:
--Klein et al., "Inhomogeneous Textures in Tantalum Sheets" Materials Science Forum, vol. 157-162, pg. 1423, (1994).--

Title Page 3, Item 56 OTHER PUBLICATIONS, please insert:
--Clark et al., "Influence of Transverse Rolling on the Microstructural and Texture Development in Pure Tantalum", Metallurgical Transactions, vol. 23A, pp. 2183-2191, August 1992.--

Title Page 3, Item 56 OTHER PUBLICATIONS, please insert:
--Raabe et al., "Texture and Microstructure of Rolled and Annealed Tantalum", Materials Science and Technology, vol. 10, pp. 299-305, April 1994.--

Title Page 3, Item 56 OTHER PUBLICATIONS, please insert:
--Wright et al., "Texture Gradient Effects in Tantalum", International Conference on Textures of Materials, 7 pages, September 1993.--

Title Page 3, Item 56 OTHER PUBLICATIONS, please insert:
--BPAI Patent Interference No. 105, 158 Judgment, Turner v. Michaluk, 5/19/2004.--

UNITED STATES PATENT AND TRADEMARK OFFICE
CERTIFICATE OF CORRECTION

| | |
|---|---|
| PATENT NO. | : 6,955,938 B2 |
| APPLICATION NO. | : 10/229888 |
| DATED | : October 18, 2005 |
| INVENTOR(S) | : Harry Rosenberg et al. |

It is certified that error appears in the above-identified patent and that said Letters Patent is hereby corrected as shown below:

Title Page 3, Item 56 OTHER PUBLICATIONS, please insert:
--Wright et al., "Textural and Microstructural Gradient Effects on the Mechanical Behavior of a Tantalum Plate", Metallurgical Transactions A, 25A, pp. 1-17 (1994).--

Title Page 3, Item 56 OTHER PUBLICATIONS, please insert:
--Clark et al., "Effect of Processing Variables on Texture and Texture Gradients in Tantalum", Metallurgical Transactions A, vol. 22A, pp. 2039-2047, September 1991.--

Title Page 3, Item 56 OTHER PUBLICATIONS, please insert:
--Kumar et al., "Corrosion Resistant Properties of Tantalum" Corrosion 95, Paper No. 253, 14 pages (No date).--

Column 1, RELATED PATENT DATA, line 10, please delete: "filed on May 21, 1999,"

Column 3, BRIEF DESCRIPTION OF THE DRAWINGS, line 9
Replace "FIG. 3 is a schematic diagram illustration an iodide cell"
With --FIG. 3 is a schematic diagram illustration of an iodide cell--

Column 3, line 41
Replace "and $H_2SO_4$ can also can also be used for the dissolution"
With --and $H_2SO_4$ can also be used for the dissolution--

Column 5, line 19
Replace "The temperature in the synthesis zone effects the rate of"
With --The temperature in the synthesis zone affects the rate of--

Column 7, line 4
Replace "to 60 C. The KCl solution"
With --to 60°C. The KCl solution--

Column 7, line 14
Replace "Several examples were carried out according the"
With --Several examples were carried out according to the--

Column 7, line 60
Replace "The cell was heated to 850"
With --The cell was heated to 850°--

UNITED STATES PATENT AND TRADEMARK OFFICE
CERTIFICATE OF CORRECTION

PATENT NO. : 6,955,938 B2
APPLICATION NO. : 10/229888
DATED : October 18, 2005
INVENTOR(S) : Harry Rosenberg et al.

It is certified that error appears in the above-identified patent and that said Letters Patent is hereby corrected as shown below:

Column 7, line 67
Replace "to 1000-1200 C. When the feed and filament temperature"
With --to 1000-1200°C. When the feed and filament temperature--

Column 9, Claim 5, line 25
Replace "A capacitor comprising material sputter deposited from"
With --A capacitor comprising a material sputter deposited from--

Column 10, Claim 7, line 4
Replace "The capacitor of claim 6 wherein high purity tantalum"
With --The capacitor of claim 6 wherein the high purity tantalum--

Column 10, Claim 12, lines 24-26, please delete the phrase:
"total of molybdenum and tungsten and further comprises less than 50 parts per million by weight"

Signed and Sealed this

Thirteenth Day of March, 2007

JON W. DUDAS
*Director of the United States Patent and Trademark Office*